United States Patent [19]
Wolters et al.

[11] Patent Number: 5,554,559
[45] Date of Patent: Sep. 10, 1996

[54] METHOD OF MANUFACTURING A SEMICONDUCTOR DEVICE HAVING A CAPACITOR WITH A FERROELECTRIC, DIELECTRIC

[75] Inventors: Robertus A. M. Wolters; Poul K. Larsen; Mathieu J. E. Ulenaers, all of Eindhoven, Netherlands

[73] Assignee: U.S. Philips Corporation, New York, N.Y.

[21] Appl. No.: 346,975

[22] Filed: Nov. 29, 1994

Related U.S. Application Data

[62] Division of Ser. No. 206,916, Mar. 4, 1994, Pat. No. 5,396,095, which is a continuation of Ser. No. 879,636, May 7, 1992, abandoned.

[30] Foreign Application Priority Data

May 8, 1991 [EP] European Pat. Off. .............. 91201104

[51] Int. Cl.$^6$ ............................................. H01L 21/302
[52] U.S. Cl. .................. 437/62; 437/64; 437/60; 257/295; 257/310
[58] Field of Search ............................. 437/62, 64, 190, 437/195, 215, 60; 148/DIG. 14; 257/295, 310

[56] References Cited

U.S. PATENT DOCUMENTS 4,870,539 9/1989 Chance et al. .................... 29/25.42
5,214,300 5/1993 Rohrer et al. ..................... 257/295

FOREIGN PATENT DOCUMENTS 2-184079 7/1990 Japan .
2-254748 10/1990 Japan ..................... 257/310

Primary Examiner—Nam Nguyen
Assistant Examiner—Ramamohan Rao Paladugu
Attorney, Agent, or Firm—Steven R. Biren

[57] ABSTRACT

A semiconductor device in which a capacitor (2) is provided on a surface (10) of a semiconductor body (3) with a semiconductor element (1) in which a lower electrode (11), an oxidic ferroelectric dielectric (12) and an upper electrode (13) are provided in that order, the upper electrode not covering an edge of the dielectric, after which an insulating layer (14) with superimposed metal conductor tracks is provided. According to the invention, the edge of the dielectric (12) not covered by the upper electrode (13) is coated with a coating layer (14, 20, or 30) practically impervious to hydrogen, after which the device is heated in a hydrogen-containing atmosphere. Heating in a hydrogen atmosphere neutralizes dangling bonds which arise during deposition of the conductor tracks on the insulating layer, while the coating layer protects the dielectric from attacks by hydrogen. The semiconductor device then has a shorter access time.

8 Claims, 2 Drawing Sheets

METHOD OF MANUFACTURING A SEMICONDUCTOR DEVICE HAVING A CAPACITOR WITH A FERROELECTRIC, DIELECTRIC

This is a division of application Ser. No. 08/206,916, now U.S. Pat. No. 5,396,095 filed Mar. 4, 1994, which is a continuation of application Ser. No. 07/879,636, filed May 7, 1992, abandoned.

BACKGROUND OF THE INVENTION

The invention relates to a method of manufacturing a semiconductor device whereby a capacitor is provided on a surface of a semiconductor body comprising a semiconductor element in that consecutively a lower electrode, an oxidic ferroelectric dielectric, and an upper electrode are provided in such a way that the upper electrode does not cover an edge of the dielectric, after which an insulating layer with superimposed metal conductor tracks is provided. The invention also relates to a semiconductor device comprising a capacitor with a ferroelectric dielectric.

Such a method is suitable for manufacturing a semiconductor device which can operate, for example, as an electronic memory in a computer. The semiconductor body then comprises very many semiconductor elements and capacitors. Capacitors having a ferroelectric material as a dielectric form non-volatile memory elements. When an electric field is applied across a ferroelectric material and removed again, a permanent polarization of the material remains, depending on a direction of the electric field, i.e. the ferroelectric material remembers the direction of the electric field. Especially oxidic materials such as, for example, lead titanate, lead-lanthanum titanate, and lead-lanthanum-zirconium titanate exhibit ferroelectric properties.

European Patent Application 91200525.3 (PHN 13.274) discloses a method of the kind mentioned in the opening paragraph whereby a capacitor with a lower electrode comprising platinum, a ferroelectric dielectric, and an upper electrode comprising platinum are provided on a semiconductor body. Lead-zirconium titanate is used as the ferroelectric dielectric in that case. The semiconductor body also comprises a switching transistor which is connected to the capacitor by a metal conductor track of TiW and Al which is provided over an insulating layer of silicon oxide.

It is found in practice that a device manufactured by the known method described is comparatively slow and, for example, shows an access time which is longer than 100 nsec.

SUMMARY OF THE INVENTION

The invention has for its object inter alia to provide a method by which a device with a shorter access time is made.

According to the invention, the method mentioned in the opening paragraph is for this purpose characterized in that the edge of the dielectric not covered by the upper electrode is covered with a coating layer which is practically imperviable to hydrogen, and in that then the device is heated in an atmosphere which contains hydrogen.

It is found that the manufacture of a device by the known method leads to free or "dangling" bonds being formed in a surface layer of the insulating layer when the metal conductor track is formed on this layer. In the known method, the device cannot be heated in an atmosphere containing hydrogen in a usual manner in order to bind these dangling bonds with hydrogen and thus to neutralize them. In fact, the oxidic ferroelectric material would also be heated in an atmosphere containing hydrogen then and be reduced to form an electrically conducting material. By covering the edge of the dielectric not covered by the upper electrode with a coating layer which is practically imperviable to hydrogen before heating in an atmosphere containing hydrogen, upon which healing takes place in an atmosphere containing hydrogen, the dangling bonds are neutralized. As the coating layer, for example, a silicon nitride or a silicon oxynitride layer is provided. The access times of approximately 100 nsec may then be reduced to less than 25 nsec.

A small quantity of hydrogen may diffuse through the upper electrode and reduce the ferroelectric dielectric situated below the upper electrode. An upper electrode made of an oxidic conductor such as $La_{0.5}Sr_{0.5}CoO_3$ may also be used. Such an upper electrode could also be attacked by the hydrogen. Preferably, therefore, the coating layer is provided over substantially the entire upper electrode.

Preferably, the method according to the invention is characterized in that a silicon nitride layer is provided as the coating layer. Silicon nitride forms a very good barrier against hydrogen, while silicon nitride is often used in practice as a passivating layer over an entire semiconductor device, the equipment necessary for this being available. In addition, silicon nitride can be very well selectively etched relative to silicon oxide, so that silicon nitride can be easily brought into a pattern whereby silicon nitride can be provided only at the area of the capacitor. The provision of the silicon nitride may be effected by a known technique such as, for example, deposition from a gas phase (CVD). In particular, silicon nitride provided at a temperature of approximately 800° C. forms a very good barrier against hydrogen.

An additional advantage is obtained when a layer of silicon oxide is provided between the silicon nitride layer and the surface of the semiconductor body. Mechanical stresses can occur in the silicon nitride, causing cracks or shifts in conductor tracks or electrodes of the capacitor. A silicon oxide layer is capable of absorbing these stresses, so that the conductor tracks and the electrodes remain intact. The silicon oxide layer may be provided in a known manner (for example, in a 1 atm. SILOX process), possibly supported by a plasma (PECVD).

A further embodiment is characterized in that a hydrogen-absorbing layer is provided as the coating layer. A layer of, for example, nickel or palladium may be provided as the hydrogen-absorbing layer. This layer may also serve as a conductor track. The absorbing layer must have such a thickness that only a very small quantity of hydrogen can penetrate the ferroelectric dielectric during heating in the hydrogen atmosphere.

Preferably, palladium is provided as the hydrogen-absorbing layer. Palladium absorbs hydrogen well, while it is also easily provided, for example, by a sputtering process.

If a conducting hydrogen-absorbing layer is used, the capacitor may be short-circuited. Preferably, an insulating auxiliary layer is provided between the hydrogen-absorbing layer and the surface of the semiconductor body. The provision of the insulating auxiliary layer means that the conducting hydrogen-absorbing layer need not necessarily be removed and can even be used as an additional conductor track.

Preferably, a silicon nitride layer is provided as the auxiliary layer by means of a plasma enhanced deposition process from the gas phase (Plasma Enhanced Chemical Vapor Deposition, PECVD). PECVD silicon nitride is provided at a comparatively low temperature of between approximately 200° and 350° C., so that the influence of the temperature on the semiconductor device is small. Silicon nitride provided by means of PECVD, however, contains a quantity of hydrogen. During heating of the semiconductor device, this hydrogen can diffuse into the ferroelectric dielectric and cause a degradation of this dielectric. The absorption layer absorbs hydrogen from the silicon nitride layer and thus ensures a low hydrogen pressure in the silicon nitride, so that the hydrogen will not diffuse from the silicon nitride layer into the ferroelectfie dielectric. In addition, the transmissivity of the silicon nitride layer for hydrogen is small.

The invention also relates to a semiconductor device comprising a semiconductor body with a semiconductor element and a surface on which is present a capacitor with a lower electrode, an oxidic ferroelectric dielectric, and an upper electrode which does not cover an edge of the dielectric, an insulating layer with superimposed metal conductor tracks being provided on the semiconductor body. According to the invention, said device is characterized in that a coating layer which is practically imperviable to hydrogen is provided at the area of the said edge. Such a semiconductor device can be heated in a hydrogen-containing atmosphere in order to reduce its access time without the oxidic ferroelectfic dielectric being attacked.

During heating in a hydrogen-containing atmosphere, a small quantity of hydrogen can diffuse through the upper electrode and reduce the ferroelectric dielectric situated below the upper electrode. Preferably, therefore, the coating layer is provided over substantially the entire upper electrode.

Preferably, the device according to the invention is characterized in that a silicon nitride layer is provided as the coating layer. Silicon nitride forms a very good barrier against hydrogen, while silicon nitride is often used in practice as a passivating layer over an entire semiconductor device, the equipment necessary for this being available. In addition, silicon nitride can be very well selectively etched relative to silicon oxide. The provision of the silicon nitride can take place by a known technique such as, for example, deposition from a gas phase (CVD). Especially silicon nitride provided at a temperature of approximately 800° C. forms a very good barrier against hydrogen, so that the semiconductor device can be heated in a hydrogen-containing atmosphere.

An additional advantage is obtained when a layer of silicon oxide is provided between the silicon nitride layer and the surface of the semiconductor body. Mechanical stresses can occur in the silicon nitride, causing cracks or shifts in conductor tracks or capacitor electrodes. A layer of silicon oxide is capable of absorbing these stresses, so that the conductor tracks and the electrodes remain intact.

A further embodiment is characterized in that a hydrogen-absorbing layer is provided as the coating layer. A layer of, for example, nickel or palladium may be provided as the hydrogen-absorbing layer. The semiconductor device can then be heated in a hydrogen-containing atmosphere without the oxidic ferroelectric dielectric being attacked. The said layer may also serve as a conductor track. The absorbing layer must have such a thickness that only a very small quantity of hydrogen can penetrate the ferroelectric dielectric during heating in the hydrogen-containing atmosphere.

Preferably, palladium is provided as the hydrogen-absorbing layer. Palladium absorbs hydrogen well, while it is also easily provided, for example, by a sputtering process.

If a conducting hydrogen-absorbing layer is used, the capacitor may be short-circuited. Preferably, an insulating auxiliary layer is provided between the hydrogen-absorbing layer and the surface of the semiconductor body. Thanks to this insulating auxiliary layer, the absorbing layer may be used as an additional conductor track.

Preferably, a silicon nitride layer is provided as the auxiliary layer by means of a plasma enhanced deposition process from the gas phase (Plasma Enhanced Chemical Vapor Deposition, PECVD). PECVD silicon nitride is provided at a comparatively low temperature of between approximately 200° and 350° C., so that the influence of the temperature on the semiconductor device is small. Silicon nitride provided by means of PECVD, however, contains a quantity of hydrogen. During heating of the semiconductor device, this hydrogen can diffuse into the ferroelectric dielectric and cause a degradation of this dielectric. The absorption layer absorbs hydrogen from the silicon nitride layer and thus ensures a low hydrogen pressure in the silicon nitride, so that the hydrogen will not diffuse from the silicon nitride layer into the ferroelectric dielectric. In addition, the transmissivity of the silicon nitride layer for hydrogen is small.

BRIEF DESCRIPTION OF THE DRAWINGS

The invention will be explained in more detail below by way of example with reference to drawings, in which.

The Figures are purely diagrammatic and not drawn to scale. Corresponding pans are generally given the same reference numerals in the Figures.

DESCRIPTION OF THE PREFERRED EMBODIMENTS

Figure 1:
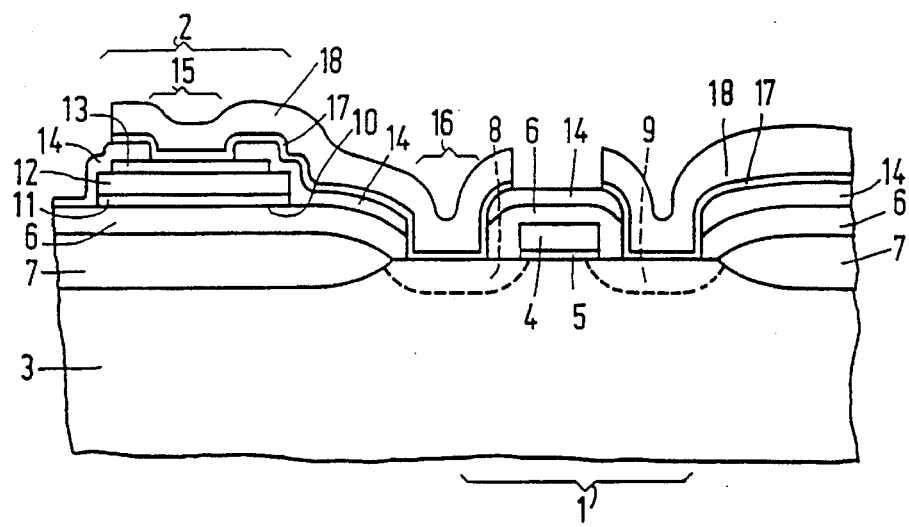
FIG. 1 is a cross-section of a semiconductor device having a capacitor at a surface comprising a ferroelectric dielectric provided with a coating layer according to the invention.

FIG. 1 shows a cross-section of a semiconductor device made according to the invention. In the method according to the invention, a semiconductor device is manufactured in that a capacitor 2 is provided on a surface 10 of a semiconductor body 3 comprising a semiconductor element 1 through the provision of a lower electrode 11, an oxidic ferroelectric dielectric 12, and an upper electrode 13 in that order, the upper electrode not covering an edge of the dielectric, after which an insulating layer 14 with superimposed metal conductor tracks 17 and 18 is provided. Such a semiconductor device forms a memory element with switching electronics. For that purpose, a semiconductor element 1 acting as a switching transistor is connected to a capacitor 2. Only one transistor 1 and one capacitor 2 are drawn for simplity's sake, but in practice the semiconductor body 3 comprises very many such transistors and capacitors. The MOS transistor is provided in usual manner in the silicon semiconductor body 3 with a gate electrode 4 of polycrystalline silicon insulated from the semiconductor body 3 by a silicon oxide layer 5 having a thickness of approximately 30 nm. The gate electrode 4 is further insulated by means of a silicon oxide layer 6. Different transistors are separated from one another by field oxide regions 7. Source and drain regions 8 and 9 of the transistor are made through diffusion between field oxide 7 and gate electrode 4. The semiconductor further comprises the surface 10 on which the capacitor 2 forming a memory element is provided in known manner with a lower electrode 11 comprising platinum, a ferroelectric dielectric 12, and an upper electrode 13 comprising platinum. The lower electrode 11 is provided, for example, through a sputtering process on a Si <100> slice 3, which is provided with an approximately 600 nm thick layer of $SiO_2$ 6 in that a 20 nm thick layer of titanium is deposited, a 39 nm thick layer of platinum is deposited, and then 5 nm titanium is deposited again, upon which the lower electrode is heated for one hour at 750° C. in an $N_2/O_2$ 4:1 atmosphere. A lower electrode with a thickness of approximately 75 nm and comprising platinum is then present with good adhesion on the semiconductor surface. The square resistance is approximately 4 Ω. The lower electrode has a roughness of approximately 0.01 μm. After the lower electrode has been provided, the ferroelectric dielectric 12, for example lead-zirconium titanate, is provided on the electrode material 11. The starting material for this is a solution of lead ethylhexanoate, zirconium acetylacetonate and titanium-n-butoxide in n-butanol (molar concentrations approximately 0.2–0.5). This solution is provided on the lower electrode by means of a spinning process in a centrifuge (rotation speed approximately 500–1500 rpm). Baking takes place at approximately 700° C. for 6 hours in a furnace with an $N_2/O_2$ 4:1 atmosphere. The layer thickness of the ferroelectric material obtained by one spinning process and one baking cycle is approximately 0.1 μm. To obtain a desired layer thickness of approximately 0.5 μm, this process is carried out five times. A typical composition of lead-zirconium titanate obtained by the process indicated above is $PbZr_{0.47}Ti_{0.53}O_3$. The lower electrode 11 and the dielectric 12 are then etched into a pattern. An upper electrode 13 is provided on the ferroelectric dielectric 12 in the same way as the lower electrode 11, except for the heating step, which takes place at the baking temperature of the dielectric, so at approximately 700° C. The surface of the capacitor 2 is then coated with an insulating layer 14. Contact holes 15 and 16 are etched in this layer. The upper electrode 13 is connected to the source region 8 of the transistor 1 through these contact holes by means of metal conductor tracks 17 and 18. For example, a usual alloy of titanium and tungsten is provided as layer 17, and an aluminum alloy as layer 18. The transistor 1 and the capacitor 2 are connected to switching electronics in the semiconductor body. The lower electrode 11 is connected to a drive line, the gate electrode 4 to a word line, while the drain region 9 is connected to a so-called bit line through metal conductor tracks 17 and 18. It is possible to drive the memory element by means of voltage pulses at the various lines and to switch the ferroelectric dielectric 12 to and fro between two stable polarization states.

It is found in practice that a device made by the known method described is comparatively slow and has an access time which is, for example, longer than 100 nsec.

To manufacture a faster device, according to the invention, the method mentioned in the opening paragraph is characterized in that the edge of the upper electrode not covered by the dielectric is covered with a coating layer which is practically imperviable to hydrogen, and in that then the device is heated in an atmosphere which contains hydrogen. A device made by the known method is comparatively slow because dangling bonds are present below conductor tracks. These bonds may easily release electrons and thus affect the charge transport through the conductor tracks, which renders the device slow. The dangling bonds arise during the deposition of the metal of the conductor tracks on the region of insulating material. To obtain a good adhesion, a metal which reduces the insulating material is used, for example titanium or aluminum, whereby dangling bonds are created. These bonds are neutralized by a heat treatment at approximately 450° C. in an atmosphere containing hydrogen for approximately 30 minutes. During the heat treatment, the hydrogen diffuses through the insulating layer or through the conductor tracks and chemically joins itself to the dangling bond, so that the dangling bond is neutralized. The charge transport through the conductor tracks is then no longer hampered, which renders the device faster. A disadvantage of the heat treatment in an atmosphere containing hydrogen is that the oxidic ferroelectric dielectric is also reduced by the hydrogen and thus loses its ferroelectric characteristics. In particular, hydrogen diffuses to the dielectric through the edge not covered by the upper electrode. To prevent the penetration of hydrogen into the ferroelectric dielectric, according to the invention, a coating layer which is practically imperviable to hydrogen is provided at the area of the edge. The insulating layer 14 in FIG. 1, for example, may be provided to form such a coating layer. It is alternatively possible to provide a separate coating layer over the non-covered edge of the capacitor. The coating layer may be, for example, a silicon nitride or silicon oxynitride layer provided by a usual deposition process from the gas phase (CVD). By way of example, a silicon nitride layer is provided over the upper electrode 13 comprising platinum of the capacitor 2 in that silane and ammonia are made to react in usual manner in a deposition reactor at approximately 700° C. An approximately 0.1 μm thick insulating layer 14 of silicon nitride is then provided, for example. Such a silicon nitride layer contains up to approximately 8 at % hydrogen. This quantity, however, is not high enough to cause damage to the dielectric. Contact holes 15 and 16 are etched in the silicon nitride layer previously provided, upon which a 100 nm thick layer 17 of a titanium-tungsten alloy (for example $Ti_{20}W_{80}$) is provided through a sputtering process, followed by a 500 nm thick layer 18 of aluminum. Dangling bonds are present at the interface between the silicon nitride layer 14 and the titanium-tungsten layer 17, which bonds are neutralized by a heat treatment of approximately 30 minutes at 450° C. in an atmosphere containing hydrogen (for example, $N_2/H_2$ 4:1). The silicon nitride layer 14 then forms an effective barrier against the hydrogen, so that the ferroelectric dielectric is not reduced during the neutralization of the dangling bonds.

Figure 2:
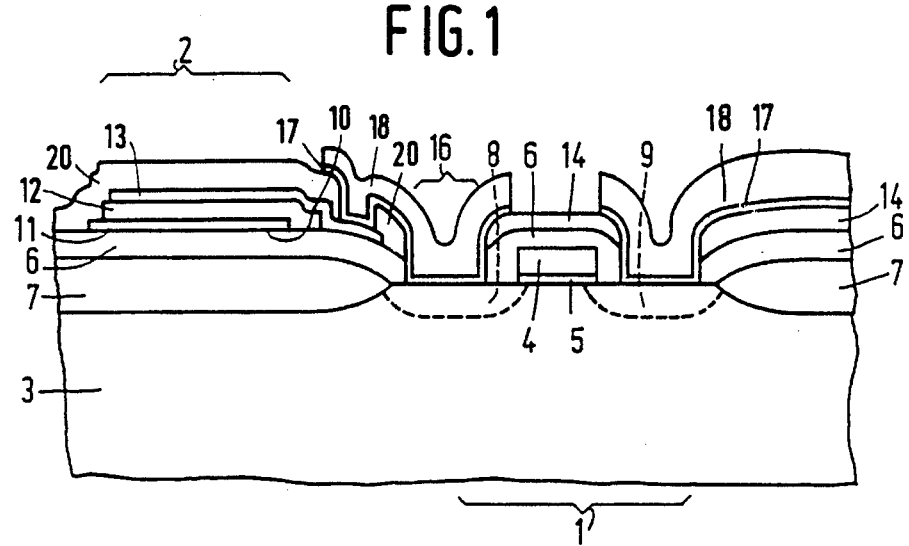
FIGS. 2 to 5 are cross-sections of semiconductor devices, each having a capacitor at a surface with a ferroelectric dielectric provided with a coating layer according to further embodiments of the invention.

The upper electrode in the known device is made of platinum, possibly provided with a titanium adhesion layer. A small quantity of hydrogen may diffuse through the upper electrode, for example at the contact hole 15, and reduce the ferroelectric dielectric 12 situated below the upper electrode 13. This may lead to a change in the capacitance value of the capacitor, since the reduction of a ferroelectric dielectric by hydrogen leads to the creation of a conductive layer, which reduces the thickness of the dielectric or even completely short-circuits the capacitor. It is also possible for an upper electrode made of an oxidic conductor to be used, such as, for example, $La_{0.5}Sr_{0.5}CoO_3$, which can be attacked by the hydrogen. Preferably, therefore, the coating layer is provided over substantially the entire upper electrode. FIG. 2 shows a semiconductor device in which the capacitor 2 is provided with a lower electrode 11, a ferroelectric dielectric 12 which fully covers the lower electrode 11, and an upper electrode 13 which forms a connection to a conductor track of titanium 17 and aluminum 18. The upper electrode 13 is fully covered by a coating layer 20 which is practically imperviable to hydrogen, so that during a heat treatment of the device in an atmosphere containing hydrogen substantially no hydrogen can penetrate the dielectric. A silicon nitride layer with a thickness of approximately 300 nm is preferably provided as the coating layer 14 or 20 practically imperviable to hydrogen. Silicon nitride forms a very good barrier against hydrogen because of its high density. In practice, silicon nitride is often used as a passivating layer over an entire semiconductor device, so that the necessary deposition equipment is available. In addition, silicon nitride can be selectively etched relative to silicon oxide by means of a wet etching step with phosphoric acid of 140° C. The silicon nitride may be provided by a known technique such as, for example, deposition from a gas phase (CVD).

Figure 3:
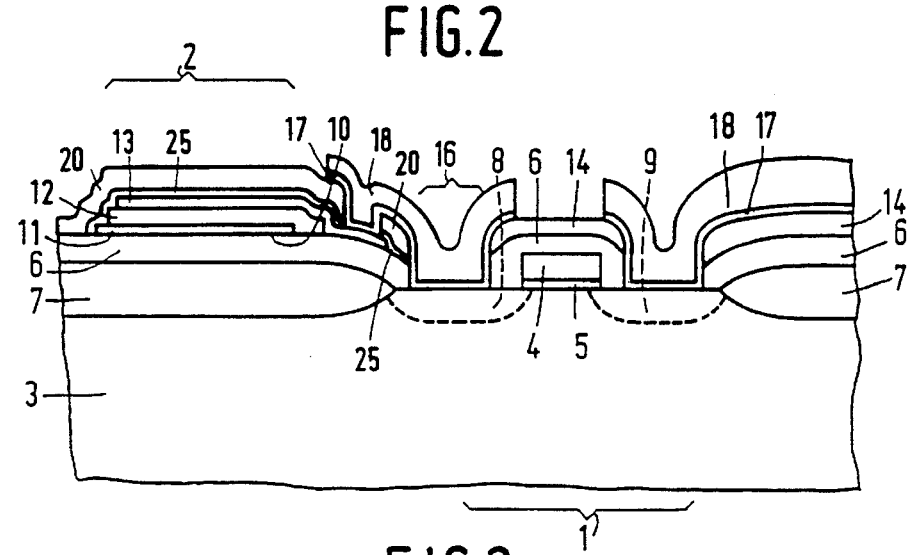

In FIG. 3, a layer of silicon oxide 25 with a thickness of 50 nm is provided over the upper electrode 13, over which again the silicon nitride layer 20 of 300 nm thickness is provided. An additional advantage is obtained in this way, since mechanical stresses which may occur in the silicon nitride and which may cause cracks or shifts in conductor tracks or electrodes of the capacitor are reduced.

Figure 4:
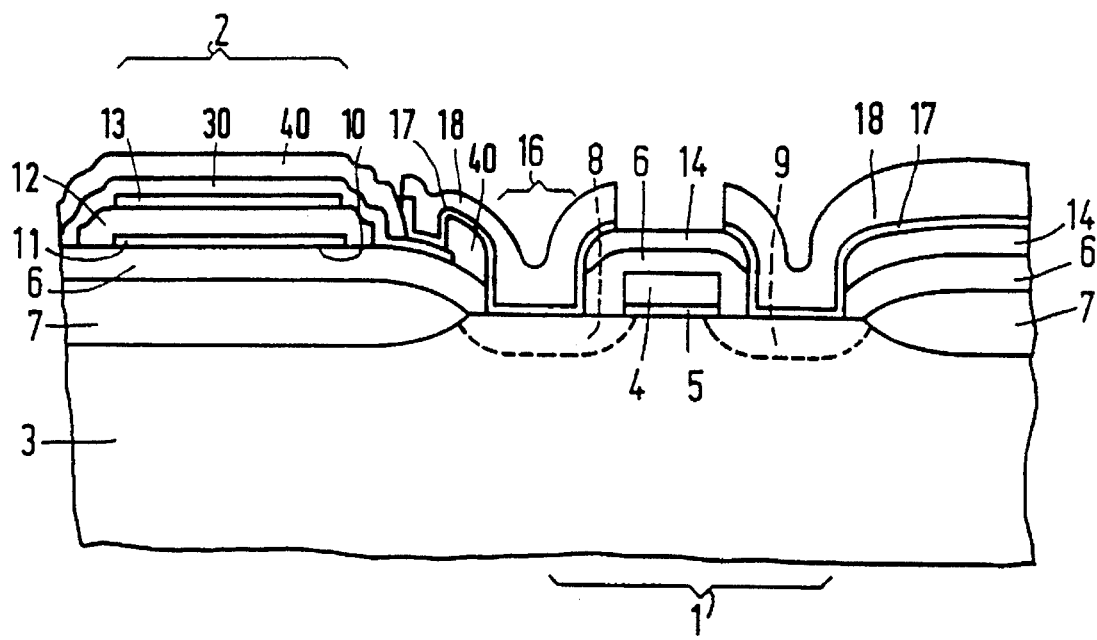
Figure 5:
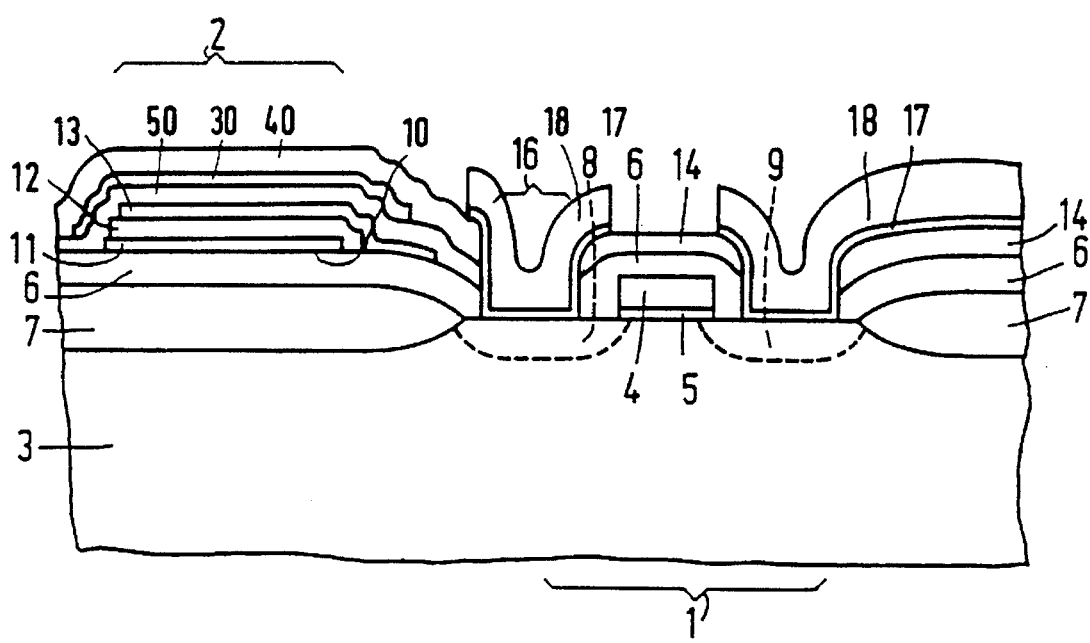

A further embodiment preferably comprises a hydrogen-absorbing layer 30 (see FIG. 4) as the coating layer. A layer of, for example, nickel or palladium may be used as the hydrogen-absorbing layer. These layers may be provided by means of usual techniques such as CVD or sputtering. In FIG. 4, a palladium layer is provided over the upper electrode 13 of the capacitor by way of hydrogen-absorbing layer 30. This layer may also be used as an additional conductor track, as shown in FIG. 4. The palladium layer may be covered in usual manner by, for example, a silicon oxide layer 40. Palladium absorbs hydrogen well, while it is also easy to provide, for example, by a sputtering process. The absorbing layer must have such a thickness that only a very small quantity of hydrogen can penetrate the ferroelectric dielectric during heating in the hydrogen atmosphere, for example, a thickness of 0.2 μm palladium for a heat treatment of 30 minutes at 450° C. The palladium layer may short-circuit the capacitor, which is why preferably first an insulating auxiliary layer 50 of silicon oxide or silicon nitride is provided before the hydrogen-absorbing layer 30 is provided (see FIG. 5). Preferably, a silicon nitride layer provided by means of a plasma enhanced deposition process from the gas phase (PECVD) is used for the layer 50. Such a layer may be provided at a comparatively low temperature of between 200° and 350° C., so that the temperature load on the semiconductor device is small. The palladium layer 30 may then be finished again, for example, with a silicon oxide layer 40, for example, a PECVD oxide layer.

We claim:

1. A method of manufacturing a semiconductor device in which a capacitor is provided on a surface of a semiconductor body comprising a semiconductor element whereby consecutively a lower electrode, an oxidic ferroelectric dielectric, and an upper electrode are provided in such a way that the upper electrode does not cover an edge of the dielectric, after which an insulating layer with superimposed metal conductor tracks is provided, characterized in that the edge of the dielectric not covered by the upper electrode is covered with a coating layer which is substantially imperviable to hydrogen, and in that then the device is heated in an atmosphere which contains hydrogen.

2. A method as claimed in claim 1, characterized in that the coating layer is provided over substantially the entire upper electrode.

3. A method as claimed in claim 1, characterized in that a silicon nitride layer is provided as the coating layer.

4. A method as claimed in claim 3, characterized in that a layer of silicon oxide is provided between the silicon nitride layer and the surface of the semiconductor body.

5. A method as claimed in claim 1, characterized in that a hydrogen-absorbing layer is provided as the coating layer.

6. A method as claimed in claim 5, characterized in that palladium is provided as the hydrogen-absorbing layer.

7. A method as claimed in claim 5, characterized in that an insulating auxiliary layer is provided between the hydrogen-absorbing layer and the surface of the semiconductor body.

8. A method as claimed in claim 7, characterized in that a silicon nitride layer is provided as the auxiliary layer by means of a plasma enhanced deposition process from the gas phase (Plasma Enhanced Chemical Vapour Deposition, PECVD).

* * * * *